(12) United States Patent
Kadijk

(10) Patent No.: US 9,850,907 B2
(45) Date of Patent: Dec. 26, 2017

(54) COOLING FAN

(71) Applicant: PHILIPS LIGHTING HOLDING B.V., Eindhoven (NL)

(72) Inventor: Simon Eme Kadijk, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/510,423

(22) PCT Filed: Sep. 11, 2015

(86) PCT No.: PCT/EP2015/070803
§ 371 (c)(1),
(2) Date: Mar. 10, 2017

(87) PCT Pub. No.: WO2016/041854
PCT Pub. Date: Mar. 24, 2016

(65) Prior Publication Data
US 2017/0254334 A1 Sep. 7, 2017

(30) Foreign Application Priority Data

Sep. 16, 2014 (EP) .................................. 14184971
Oct. 6, 2014 (EP) .................................. 14187762

(51) Int. Cl.
*H05K 7/20* (2006.01)
*F04D 17/16* (2006.01)
(Continued)

(52) U.S. Cl.
CPC .......... *F04D 17/16* (2013.01); *F04D 29/023* (2013.01); *F04D 29/281* (2013.01);
(Continued)

(58) Field of Classification Search
None
See application file for complete search history.

(56) References Cited

U.S. PATENT DOCUMENTS 6,330,908 B1 * 12/2001 Lee ...................... H01L 23/467
165/185
7,142,422 B2 * 11/2006 Lee ...................... H01L 23/4006
165/104.33
(Continued)

FOREIGN PATENT DOCUMENTS

JP 2007053844 A 3/2007
JP 2007281482 A 10/2007
(Continued)

OTHER PUBLICATIONS

US 8,605,438, 12/2013, Koplow (withdrawn)
(Continued)

*Primary Examiner* — Courtney Smith
(74) *Attorney, Agent, or Firm* — Akarsh P. Belagodu

(57) ABSTRACT

A cooling fan (1) for cooling an electronic device (2) is disclosed. The cooling fan (1) comprises a heat sink (5) thermally connectable to the electronic device (2), the heat sink (5) having a first clearance side (6a, 6b) centered relative to a longitudinal axis (L) of the heat sink (5), and several thermally conductive fan blades (13) arranged in a circle centered on the longitudinal axis (L). The fan blades (13) are rotatable relative to the heat sink (5) about the longitudinal axis (L) by a motor (19) and each fan blade (13) has a second clearance side (14) facing the first clearance side (6a, 6b). A clearance space (18) is provided between the first clearance side (6) and each second clearance side (14), the majority of said clearance spaces (18) having a size of 100 micrometer or less in a direction perpendicular to the first clearance side (6a, 6b) and the corresponding second clearance side (18).

9 Claims, 3 Drawing Sheets

(51) Int. Cl.
| | |
|---|---|
| *F04D 29/28* | (2006.01) |
| *F04D 29/02* | (2006.01) |
| *F21V 29/70* | (2015.01) |
| *F21V 29/60* | (2015.01) |
| *F21V 29/502* | (2015.01) |
| *H01L 23/467* | (2006.01) |
| *H01L 33/64* | (2010.01) |
| *H01L 51/52* | (2006.01) |
| *H01S 5/024* | (2006.01) |
| *F21V 29/89* | (2015.01) |
| *F21Y 115/00* | (2016.01) |

(52) U.S. Cl.
CPC ............ *F21V 29/502* (2015.01); *F21V 29/60* (2015.01); *F21V 29/70* (2015.01); *H05K 7/20172* (2013.01); *F21V 29/89* (2015.01); *F21Y 2115/00* (2016.08); *H01L 23/467* (2013.01); *H01L 33/645* (2013.01); *H01L 51/529* (2013.01); *H01S 5/02407* (2013.01)

(56) References Cited

U.S. PATENT DOCUMENTS

| | | | |
|---|---|---|---|
| 8,087,905 | B2 | 1/2012 | Wysk et al. |
| 8,559,175 | B2 * | 10/2013 | Huisman ................. F21V 29/02 174/16.1 |
| 2002/0090307 | A1 * | 7/2002 | Cheng .................. F04D 29/582 417/423.1 |
| 2002/0187059 | A1 * | 12/2002 | Gold ..................... F04D 25/082 417/366 |
| 2004/0108104 | A1 * | 6/2004 | Luo ......................... F28F 13/00 165/181 |
| 2004/0114327 | A1 * | 6/2004 | Sri-Jayantha ......... H01L 23/467 361/695 |
| 2004/0261975 | A1 | 12/2004 | Kozyra et al. |
| 2006/0021735 | A1 | 2/2006 | Lopatinsky et al. |
| 2010/0014251 | A1 * | 1/2010 | Refai-Ahmed ....... H01L 23/467 361/701 |
| 2010/0328887 | A1 * | 12/2010 | Refai-Ahmed ....... H01L 23/427 361/697 |
| 2011/0103011 | A1 * | 5/2011 | Koplow .............. F04D 25/0606 361/679.54 |
| 2012/0223640 | A1 | 9/2012 | Koplow |
| 2012/0305224 | A1 | 12/2012 | Kim et al. |

FOREIGN PATENT DOCUMENTS

| | | |
|---|---|---|
| JP | 2011530191 A | 12/2011 |
| JP | 2013020746 A | 1/2013 |

OTHER PUBLICATIONS

S. Kadijk, "Sandia Heat Sink Assessment, Update III", Philips Lighting BV, Aug. 25, 2011, pp. 1-6.

J.P. Koplow, "A Fundamentally New Approach to Air-Cooled Heat Exchangers", Sandia Report, Sandia National Laboratories, Jan. 2010, pp. 1-48.

* cited by examiner

COOLING FAN

CROSS-REFERENCE TO PRIOR APPLICATIONS

This application is the U.S. National Phase application under 35 U.S.C. §371 of International Application No. PCT/EP2015/070803, filed on Sep. 11, 2015, which claims the benefit of European Patents Applications Nos. 14187762.1, filed on Oct. 6, 2014, and 14184971.1, filed on Sep. 16, 2014. These applications are hereby incorporated by reference herein.

TECHNICAL FIELD

The present disclosure relates to a cooling fan for cooling electronic devices.

BACKGROUND

Lamps, computer components and many other types of electronic devices generate heat during operation and may have to be cooled for optimal performance. Various cooling techniques are known in the art, one of them being air cooling by the use of fans. Cooling fans typically include a heat sink which removes heat from the electronic device and from which heat is transferred to the ambient air through forced convection generated by the fan.

An example of a cooling apparatus for an electronic device is disclosed in U.S. Pat. No. 8,087,905 B2. This cooling apparatus has a motor-driven impeller which coaxially encloses a heat sink with cooling fins. The rotation of the impeller generates a flow of air through the space between the fins and out of the impeller in a radial direction.

Since cooling is critical to the functioning of many electronic devices, improving the technical performance of cooling fans is an important area of applied research.

SUMMARY

The objective of the present disclosure is to provide an improved or alternative cooling fan for cooling electronic devices. Of particular interest are the cooling efficiency and compactness of the cooling fan.

The invention is defined by the independent claim. Embodiments are set forth in the dependent claims, the description and the drawings.

According to a first aspect, a cooling fan for cooling an electronic device is disclosed. The cooling fan comprises a heat sink thermally connectable to the electronic device, the heat sink having a first clearance side centered relative to a longitudinal axis of the heat sink, and several thermally conductive fan blades arranged in a circle centered on the longitudinal axis. The fan blades are rotatable relative to the heat sink about the longitudinal axis by a motor and each fan blade has a second clearance side facing the first clearance side. A clearance space is provided between the first clearance side and each second clearance side, at least a majority of the clearance spaces having a size of 100 micrometer or less in a direction perpendicular to the first clearance side and the corresponding second clearance side. A majority of the clearance spaces may refer to at least half of the fan blades having a clearance space having a size of 100 micrometers or less.

By "a clearance space" is meant a three-dimensional region between the first clearance side of the heat sink and the second clearance side of a fan blade. It is to be understood that a clearance space has a non-zero size in the direction perpendicular to the first clearance side and the corresponding second clearance side.

The fan blades moving in close proximity to the heat sink provide for a thinning effect of the thermal boundary layer, i.e. the thin and poorly heat-conducting layer of air in the immediate vicinity of the first clearance side of the heat sink, something which contributes to the efficient transfer of heat away from the heat sink. Having the fan blades as well as the first clearance side centered relative to the longitudinal axis allows for a compact design of the cooling fan, with accompanying reduction in weight.

According to one embodiment, the first clearance side is a continuous curved side, the fan blades are arranged around the heat sink as seen along the longitudinal axis, and the clearance space has a size of 100 micrometer or less in a radial direction perpendicular to the longitudinal axis. The fan blades are configured to exhaust air (or whatever gas or fluid the cooling fan is embedded in) in the direction of the longitudinal axis during rotation in this embodiment. The relatively unimpeded airflow permitted by arranging the fan blades around the heat sink in this way may result in a reduced level of noise compared with many known cooling fans, in particular those based on forced convection through a finned heat sink where airflow against the fins generates noise.

According to an alternative embodiment, the first clearance side is a continuous planar side, the heat sink and the fan blades are separated along the longitudinal axis, and the clearance space has a size of 100 micrometer or less in a direction of the longitudinal axis. The fan blades are configured to exhaust air (or whatever gas or fluid the cooling fan is embedded in) in a radial direction in this embodiment which may be particularly suitable for cooling an electronic device that is mounted on a flat board, for example a central processing unit on a printed circuit board. In order to obtain the desired cooling, it may suffice to provide the majority, e,g, half, of the fan blades with a clearance space of 100 micrometers.

According to some embodiments, the heat sink is a solid right circular cylinder. Such heat sinks are relatively simple to manufacture.

An even smaller clearance space may improve the cooling efficiency of the cooling fan. In some embodiments, the size of the clearance space may therefore be less than 50 micrometer, alternatively less than 30 micrometer or less than 15 micrometer.

According to some embodiments, the first clearance side has a first clearance side area and each second clearance side has a second clearance side area, the combined second clearance side area of all the fan blades being from about 10% to about 50% of the first clearance side area. This may help improve the cooling efficiency of the cooling fan. The optimal percentage for a particular application depends on, for example, the rotational speed of the cooling fan.

The cooling efficiency of the cooling fan may be increased by using fan blades having a high thermal conductivity. The thermal conductivity of the fan blades is typically at least 1 watt per meter per Kelvin (W/m/K). The fan blades can be made of a material chosen from the group consisting of glass, ceramics, thermally conductive plastics and metals. Each fan blade can for example be made of aluminum or an aluminum alloy. These metals have a high thermal conductivity, making them suitable for the present invention.

The cooling fan as described above may advantageously be included in an assembly which also comprises an electronic device thermally connected to the heat sink and a motor connected to rotate the fan blades relative to the heat sink about the longitudinal axis.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
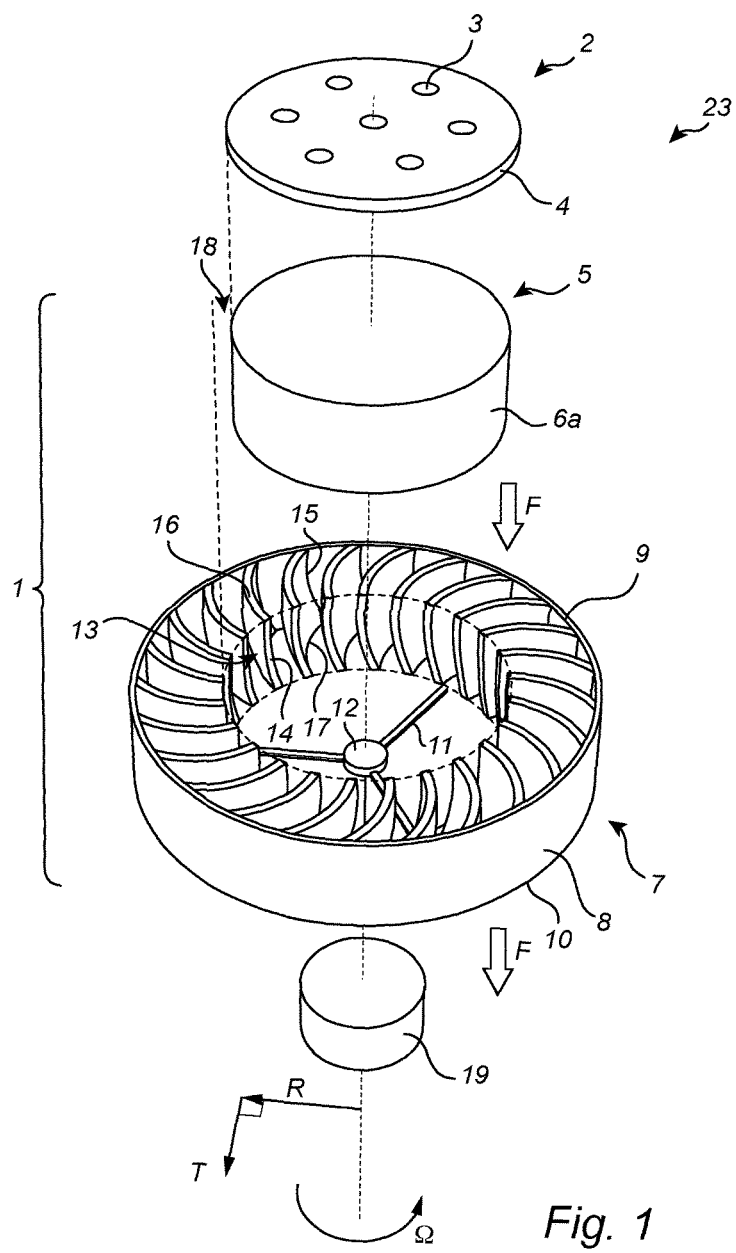
FIG. 1 shows a schematic exploded view in perspective of an embodiment of a cooling fan, an electronic device and a motor. The cooling fan in FIG. 1 is an axial-type cooling fan.
Figure 2:
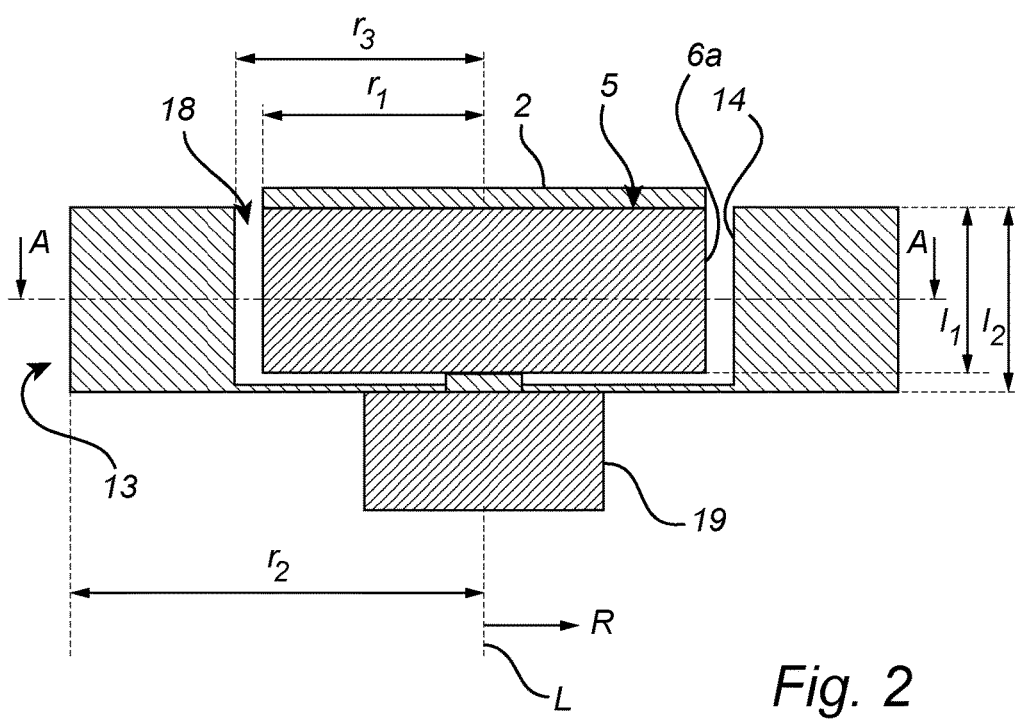
FIG. 2 is a schematic cross-sectional side view of FIG. 1.
Figure 3:
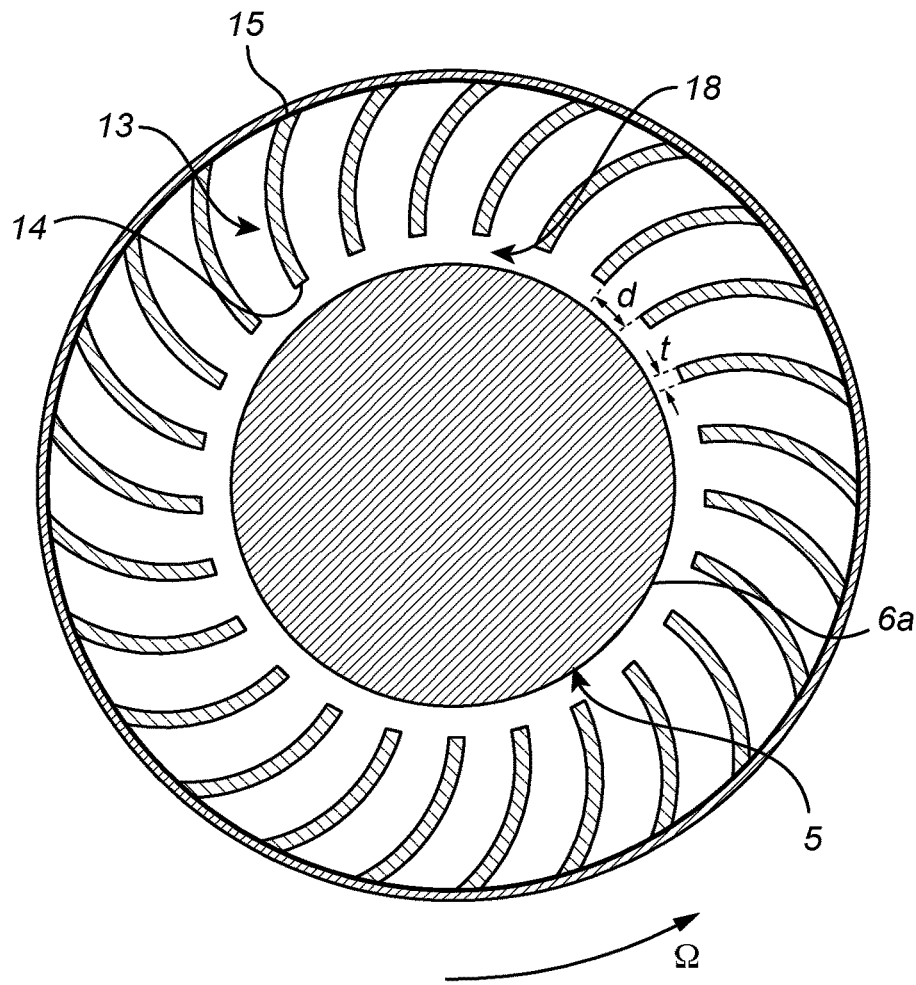
FIG. 3 is a schematic cross-sectional view along the line AA in FIG. 2.

FIGS. 1, 2 and 3 show an embodiment of a cooling fan 1 for cooling an electronic device 2. The electronic device 2 is a lamp with several light sources 3. The light sources 3 may be solid-state light sources, such as semiconductor light-emitting diodes, organic light-emitting diodes, polymer light-emitting diodes or laser diodes. The lamp 2 can for example be a spot lamp, a parabolic aluminized reflector spot lamp, a bulged reflector spot lamp, a metal halide lamp, a high intensity discharge lamp, a theatre spot lamp or a downlighter. Computer components, such as central processing units, graphics processing units and memory units, are examples of other types of electronic devices 2 which may be cooled by the fan cooler 1.

The light sources 3 are typically mounted on a carrier 4. The carrier 4 may include a circuit board, such as a printed circuit board, providing the electrical circuitry necessary for the operation of the light sources 3. The carrier 4 is mounted on a heat sink 5 so that the latter may absorb heat generated by the light sources 3. The heat sink 5 and the electronic device 2 are thus in thermal contact with each other. The shape of the heat sink 5 is that of a cylinder, more precisely that of a solid right circular cylinder. The heat sink 5 defines a central longitudinal axis L, a radial direction R and a tangential direction T. The radius $r_1$ and longitudinal length $l_1$ of the heat sink 5 both depend on the application. Typically, the longitudinal length $l_1$ is less than 5 centimeters and the radius $r_1$ is between 1 centimeter and 1 decimeter. The heat sink 5 has a first clearance side in the form of a continuous curved side 6a centered relative to the longitudinal axis L. The curved side 6a forms an outer side of the heat sink 5. The curved side 6a is circular and extends in the longitudinal direction so that the surface normal of the curved side 6a is everywhere parallel with the radial direction R. The heat sink 5 can be made of a metal or a metal alloy, such as aluminum, copper or an aluminum alloy. The heat sink 5 can be made of a composite material, for example a metal matrix composite. The heat sink 5 may comprise heat pipes or a vapor chamber for improved heat spreading.

The heat sink 5 is mounted inside a fan wheel 7 so that the fan wheel 7 encircles the heat sink 5. The fan wheel 7 is arranged coaxially with the heat sink 5, the longitudinal axis L being a common axis. The fan wheel 7 has a circular side wall 8 and a radius $r_2$ which is greater than the radius $r_1$ of the heat sink 5, typically by one centimeter or a few centimeters. As an example, the radius $r_2$ of the fan wheel 7 may be between 3 centimeters and 10 centimeters. The side wall 8 has a front edge 9 and a back edge 10, the former being located by the same side of the fan wheel 7 as the electronic device 2. The front 9 and back 10 edges are separated along the longitudinal axis L by a length $l_2$ which is typically equal to, or substantially equal to, the longitudinal length $l_1$ of the heat sink 5. One or more spokes 11 may be attached to the side wall 8 by the back edge 10 and extend radially towards a hub 12 centered on the longitudinal axis L. According to an alternative embodiment, the cooling fan 1 is provided with a front plate which is integrated with the fan blades 13 and which has spokes between $r_1$ and $r_2$ so that there are openings between the fan blades 13.

Several fan blades 13 are integrated with the wall 8. The number of fan blades 13 is usually equal to, or greater than, two. The fan blades 13 may be formed in one piece with the wall 8, for example by molding. Alternatively, the fan blades 13 may be fixedly attached to the wall 8, by soldering for instance. The fan blades 13 are thermally conductive and typically have a thermal conductivity of at least 1 W/m/K. Glass, thermally conductive plastics, ceramics and metals are examples of suitable materials of which the fan blades 13 may be formed. The fan blades 13 can for example be made of aluminum.

The fan blades 13 are arranged in a circle centered on the longitudinal axis L and around the heat sink 5 as seen along the longitudinal axis L. The fan blades 13 are rotatable relative to the heat sink 5 about the longitudinal axis L. The fan blades 13 are configured to generate an axial airflow F, i.e. to draw in air and to exhaust air along the longitudinal axis L, during rotation of the fan wheel 7 by a motor 19. How to design the fan blades 13 and how to orient them relative to each other and the direction of rotation Ω in order to generate such an airflow is well known in the art. The motor 19 is arranged coaxially with the fan blades 13, the heat sink 5 and the electronic device 2 so that the longitudinal axis L is a common axis. In general, the motor 19 may be arranged so as not to be coaxial with these other components. The motor 19 may be an electrical motor and may be configured to rotate the fan wheel 7 with a rotational speed between 200 rpm and 20000 rmp. Typically, the smaller the size of the cooling fan 1, the larger the rotational speed. The cooling fan 1, the electronic device 2 and the motor 19 form an arrangement 23.

Each fan blade 13 has a second clearance side 14, an outer side 15, a front side 16 and a back side 17. The second clearance side 14 faces the curved side 6a and extends in the longitudinal direction L and in the tangential direction T. The combined area of the second clearance sides 14 of all the fan blades 13 is usually from about 10% to about 50% of the area of the curved side 6a. Differently stated, the ratio of the distance d between two adjacent fan blades 14 to the thickness t of the second clearance sides 14 lies between 0.1 and 1, i.e. $0.1 < t/d < 1$.

The second clearance sides 14 are circularly arranged around the longitudinal axis L at a distance $r_3$ from the longitudinal axis L. The distance $r_3$ is no more than 100 micrometer greater than the radius $r_1$ of the heat sink 5. A clearance space 18 is provided between the second clearance side 14 of each fan blade 13 and the curved side 6a of the heat sink 5. The clearance spaces 18 are open in the direction of the longitudinal axis L. In the radial direction R, each clearance space 18 is delimited by the second clearance side 14 of a corresponding fan blade 13 and the curved side 6a of the heat sink 5. Each clearance space 18 has a size of 100 micrometer or less in a direction perpendicular to the curved side 6a and the corresponding second clearance side 14, i.e. in the radial direction R perpendicular to the longitudinal axis L. The size of the clearance space in the radial direction R may for example be in the range from 25 micrometer to 50 micrometer, alternatively from 15 micrometer to 30 micrometer or from 10 micrometer to 20 micrometer. In this embodiment, each clearance space 18 has a constant size in the radial direction R. The second clearance side 14 and the curved side 6a are arranged in parallel in the direction of the longitudinal axis L. In other embodiments, the clearance spaces 18 do not have a constant size in the radial direction R.

The front 16 and back 17 sides extend between the second clearance side 14 and the front 9 and back 10 edges, respectively. The outer side 14 is attached to the side wall 8 and extends between the front 16 and back 17 sides. In this embodiment, the second clearance side 14, the outer side 15, the front side 16 and the back side 17 are all curved. One or more of the second clearance side 14, the outer side 15, the front side 16 and the back side 17 may, however, be straight in other embodiments.

Figure 4:
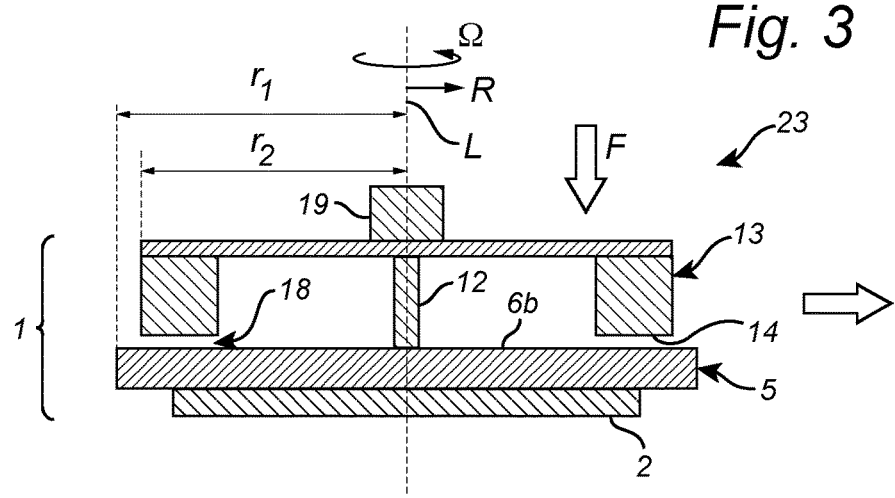
FIG. 4 shows a schematic side view of an alternative embodiment of a cooling fan, an electronic device and a motor. The cooling fan in FIG. 4 is a radial-type cooling fan.

FIG. 4 shows an embodiment of a cooling fan 1 forming an arrangement 23 together with an electronic device 2 and a motor 19. This cooling fan 1 is similar to the one described above in connection with FIGS. 1, 2 and 3. In the embodiment shown in FIG. 4, however, the first clearance side is a continuous planar side 6b and the heat sink 5 and the fan blades 13 are separated along the longitudinal axis L. Each clearance space 18 is delimited in the longitudinal direction by the second clearance side 14 of a corresponding fan blade 13 and the planar side 6b of the heat sink 5. More precisely, each clearance space 18 has a size of 100 micrometer or less in a direction perpendicular to the planar side 6b and the corresponding second clearance side 14, i.e. in the direction of the longitudinal axis L. In this embodiment, each clearance space 18 has a constant size in the direction of the longitudinal axis L. The second clearance side 14 and the planar side 6b are arranged in parallel and perpendicularly to the direction of the longitudinal axis L. In other embodiments, the clearance spaces 18 do not have a constant size in the direction of the longitudinal axis L.

The radius $r_1$ of the heat sink 5 may be equal to or greater than the radius $r_2$ of the fan wheel 7. The fan blades 13 in this embodiment are configured to generate a radial airflow F during rotation. That is to say, the fan blades 13 are configured to draw in air in the longitudinal direction and to exhaust air in a radial direction R during rotation of the fan wheel 7. How to design the fan blades 13 and how to orient them relative to each other and the direction of rotation Ω in order to generate such an airflow is well known in the art.

During operation of the cooling fan 1, the motor 19 rotates the fan wheel 7 about the longitudinal axis L in the direction of rotation Ω, whereby air is drawn in to the clearance space 18 in the longitudinal direction. The heat sink 5 is stationary during operation of the cooling fan 1, meaning that it does not rotate along with the fan wheel 7. The air is subsequently exhausted longitudinally or radially from the fan wheel 7, depending on the configuration of the cooling fan 1. As the fan wheel 7 rotates, heat is transferred from the heat sink 5, which receives heat from the electronic device 2, to the ambient air via several mechanisms.

Heat is transferred to the ambient air by conduction through the thermal boundary layer between two adjacent fan blades 13. Presumably, the radial thickness of this thermal boundary layer grows in the direction opposite to the direction of rotation Ω. Because of the sweeping action by the fan blades 13 moving close to the first clearance side 6a, 6b, the effective thickness of the thermal boundary layer between two adjacent fan blades 13 is, however, likely to be small. Since the thermal boundary layer has poor heat conductivity, the smaller its radial thickness, the more efficient the transfer of heat through that layer. The heat transferred through the boundary layer is absorbed by the air which is located between the fan blades 13 and which is continuously exhausted from the fan wheel 7 by forced convection.

Heat is also transferred from the heat sink 5 to the ambient via the fan blades 13. This mechanism involves the conduction (and radiation) of heat from the heat sink 5 through the clearance space 18 to the fan blades 18. The smaller the radial size of the clearance space 18, the greater the efficiency by which heat is transferred to the fan blades 13 through these processes. The heat absorbed by a fan blade 13 spreads throughout the fan blade 13 by conduction, due to a temperature gradient, and subsequently leaves the fan blade 13 by convection (and radiation). The transferred heat is absorbed by the air which is located between the fan blades 13 and which is continuously exhausted from the fan wheel 7 by forced convection.

The person skilled in the art realizes that the present invention by no means is limited to the preferred embodiments described above. On the contrary, many modifications and variations are possible within the scope of the appended claims. For example, the heat sink 5 can be frustoconical.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:
1. A cooling fan for cooling an electronic device, comprising
a heat sink thermally connectable to the electronic device, the heat sink having a first clearance side centered relative to a longitudinal axis of the heat sink, and
several thermally conductive fan blades arranged in a circle centered on the longitudinal axis, the fan blades being rotatable relative to the heat sink about the longitudinal axis by a motor and each fan blade having a second clearance side facing the first clearance side,
characterized in that a clearance space is provided between the first clearance side and each second clearance side, at least a majority of said clearance spaces having a size of 100 micrometer or less in a direction perpendicular to the first clearance side and the corresponding second clearance side, and
wherein the heat sink is a solid right circular cylinder.

2. The cooling fan according to claim 1, wherein
the first clearance side is a continuous curved side,
the fan blades are arranged around the heat sink as seen along the longitudinal axis, and
the clearance space has a size of 100 micrometer or less in a radial direction perpendicular to the longitudinal axis.

3. The cooling fan according to claim 1, wherein
the first clearance side is a continuous planar side,
the heat sink and the fan blades are separated along the longitudinal axis, and
the clearance space has a size of 100 micrometer or less in a direction of the longitudinal axis.

4. The cooling fan according to claim 1, wherein the size of the clearance space is less than 50 micrometer, alternatively less than 30 micrometer or less than 15 micrometer.

5. The cooling fan according to claim 1, wherein the first clearance side has a first clearance side area and each second clearance side has a second clearance side area, the combined second clearance side area of all the fan blades being from about 10% to about 50% of the first clearance side area.

6. The cooling fan according to a claim 1, wherein the fan blades have a thermal conductivity of at least 1 watt per meter per kelvin.

7. The cooling fan according to claim 1, wherein the fan blades are made of a material chosen from the group consisting of glass, ceramics, thermally conductive plastics and metals.

8. The cooling fan according to claim 7, wherein each of the fan blades is made of aluminum or an aluminum alloy.

9. An assembly comprising, the cooling fan according to claim 1; the electronic device thermally connected to the heat sink; and the motor connected to rotate the fan blades relative to the heat sink about the longitudinal axis.

* * * * *